(12) United States Patent
Zhang et al.

(10) Patent No.: US 10,634,623 B2
(45) Date of Patent: Apr. 28, 2020

(54) PHASE CONTRAST MONITORING FOR EXTREME ULTRA-VIOLET (EUV) MASKS DEFECT INSPECTION

(71) Applicant: KLA-Tencor Corporation, Milpitas, CA (US)

(72) Inventors: Qiang Zhang, Fremont, CA (US); Rui-fang Shi, Cupertino, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 50 days.

(21) Appl. No.: 15/593,163

(22) Filed: May 11, 2017

(65) Prior Publication Data

US 2018/0100814 A1     Apr. 12, 2018

Related U.S. Application Data

(60) Provisional application No. 62/405,826, filed on Oct. 7, 2016.

(51) Int. Cl.
| | |
|---|---|
| *G01N 21/956* | (2006.01) |
| *G03F 1/84* | (2012.01) |
| *G01N 21/33* | (2006.01) |

(52) U.S. Cl.
CPC . *G01N 21/95607* (2013.01); *G01N 21/95623* (2013.01); *G03F 1/84* (2013.01); *G01N 21/33* (2013.01); *G01N 2021/95676* (2013.01)

(58) Field of Classification Search
None
See application file for complete search history.

(56) References Cited

U.S. PATENT DOCUMENTS

| | | | |
|---|---|---|---|
| 5,270,796 A | 12/1993 | Tokui | |
| 5,448,336 A * | 9/1995 | Shiraishi | G03F 7/701 355/53 |

(Continued)

FOREIGN PATENT DOCUMENTS

WO     2013158593 A1     10/2013

OTHER PUBLICATIONS

PCT Written Opinion, PCT/US2017/055671, U.S. Appl. No. 15/593,163, dated Jan. 19, 2018., 14 pages.

(Continued)

*Primary Examiner* — Edwin C Gunberg
(74) *Attorney, Agent, or Firm* — Kwan & Olynick LLP

(57) ABSTRACT

Disclosed are methods and apparatus for inspecting an extreme ultraviolet (EUV) reticle using an optical inspection tool. An inspection tool having a pupil filter positioned at an imaging pupil is used to obtain a test image or signal from an output beam that is reflected and scattered from a test portion of an EUV test reticle. The pupil filter is configured to provide phase contrast in the output beam. A reference image or signal is obtained for a reference reticle portion that is designed to be identical to the test reticle portion. The test and reference images or signals are compared and it is determined whether the test reticle portion has any candidate defects based on such comparison. For each of a plurality of test reticle portions of the reticle, the operations for using the inspection tool, obtaining a reference image or signal, comparing, and determining are repeated. A defect report is generated based on any candidate defects that have been determined to be present.

24 Claims, 7 Drawing Sheets

(56) References Cited

U.S. PATENT DOCUMENTS

| | | |
|---|---|---|
| 6,327,033 B1 | 12/2001 | Ferguson et al. |
| 6,646,281 B1 | 11/2003 | Krantz |
| 6,727,512 B2 | 4/2004 | Stokowski |
| 7,123,356 B1 | 10/2006 | Stokowski et al. |
| 2010/0149505 A1 | 6/2010 | Sewell et al. |
| 2014/0268091 A1 | 9/2014 | Lu et al. |
| 2014/0307254 A1 | 10/2014 | Yamashita et al. |

OTHER PUBLICATIONS

International Search Report for PCT/US2017/055671, U.S. Appl. No. 15/593,163, dated Jan. 19, 2018., 3 pages.

"Application of Differential Phase Contrast Imaging to EUV Mask Inspection: A Numerical Study", Xibin Zhou, Dominic Ashworth, Frank Goodwin, Kevin Cummings, "Application of differential phase contrast imaging to EUV mask inspection: a numerical study", Proc. SPIE 9422, Extreme Ultraviolet (EUV) Lithography VI, 94221E (Apr. 6, 2015), Apr. 6, 2015, 7 pages.

"Zernike Phase Contrast Microscope for EUV Mask Inspection", Yow-Gwo Wang, Ryan Miyakawa, Andrew Neureuther, Patrick Naulleau, "Zernike phase contrast microscope for EUV mask inspection", Proc. SPIE 9048, Extreme Ultraviolet (EUV) Lithography V, 904810 (Apr. 17, 2014); doi: 10.1117/12.2048180, Apr. 17, 2004, 8 pages.

\* cited by examiner

PHASE CONTRAST MONITORING FOR EXTREME ULTRA-VIOLET (EUV) MASKS DEFECT INSPECTION

CROSS-REFERENCE TO RELATED APPLICATION

This application claims priority of U.S. Provisional Patent Application No. 62/405,826, entitled "Phase Contrast Imaging for Extreme Ultraviolet Photomask Inspection", filed 7 Oct. 2016 by Qiang Zhang et al., which application is incorporated herein by reference in its entirety for all purposes.

TECHNICAL FIELD OF THE INVENTION

The invention generally relates to the field of reticle inspection and metrology. More particularly the present invention relates to inspection and measurement of extreme ultra-violet (EUV) reticles for detecting defects.

BACKGROUND

After decades of research and development in EUVL (EUV lithography), it appears that EUVL is finally becoming a reality. There were at least fourteen EUV scanners installed worldwide as of the beginning of 2017. The industry consensus seems to be that there is no fundamental technical road block in the implementation of EUVL.

This move towards EUVL has resulted in several competing EUV reticle pattern inspection technologies. One approach is an actinic inspection, which currently has an unacceptable throughput. Two other inspection possibilities include e-beam inspection and DUV inspection. In the DUV inspection approach, a wavelength (typically at 193 nm), which is very different from the EUVL wavelength of 13.5 nm, is used to inspect EUV photomasks. Due to the significant wavelength mismatch, signals from a critical defect on an EUV mask can be very weak. In view of the forgoing, it would be beneficial to find innovative techniques to enhance the defect signals where appropriate.

SUMMARY

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method of inspecting an extreme ultraviolet (EUV) reticle using an optical inspection tool is disclosed. An inspection tool having a pupil filter positioned at an imaging pupil is used to obtain a test image or signal from an output beam that is reflected and scattered from a test portion of an EUV test reticle. The pupil filter is configured to provide phase contrast in the output beam. A reference image or signal is obtained for a reference reticle portion that is designed to be identical to the test reticle portion. The test and reference images or signals are compared and it is determined whether the test reticle portion has any candidate detects based on such comparison. For each of a plurality of test reticle portions of the reticle, the operations for using the inspection tool, obtaining a reference image or signal, comparing, and determining are repeated. A defect report is generated based on any candidate defects that have been determined to be present.

In a specific implementation, the pupil filter is configured to provide phase contrast in the output beam so as to enhance the signal strength of a phase object as compared to a non-phase or differently phased object in the test reticle portion. In a further aspect, the pupil filter is configured to provide phase contrast in the output beam to introduce a phase change so that a phase between light scattered from a phase object more closely matches light reflected from such phase object and such scattered and reflected light can constructively interfere with each other to enhance the phase object's detected image signal.

In another embodiment, the pupil filter is a slab of glass, such as fused silica, that has an etched portion having a depth corresponding to an amount of phase change that is introduced into a portion of the output beam that is transmitted through the pupil filter. In one aspect, the etched depth is about 85 nm to provide a phase change of 90° at the inspection tool wavelength, e.g. 19.3 nm. In one embodiment, the etched portion of the pupil filter has a width that substantially matches an illumination area, which corresponds to a reflected portion of the output light, so as to provide a phase change within such illumination area and not outside such illumination area, which corresponds to a scattered light portion of the output light. In a further aspect, the illumination area corresponds to a sigma 0.5 illumination and the width of the pupil filter equals about half of an aperture diameter of the imaging pupil. In another aspect, the illumination may correspond to a pupil area that is either smaller or larger than sigma 0.5. In another aspect, the pupil filter comprises a plurality of half-tone patterns on a side of the glass that is opposite to a side that includes the etched portion. In this aspect, the half-tone patterns are sized and arranged to control the transmission of the output light.

In an alternative embodiment, the method further includes designing the phase filter by simulating defect intensity signals for a plurality of detect types as a function of a phase change angle produced by a plurality of pupil filter configurations. In another embodiment, the pupil filter is configured to provide phase contrast in the output beam so as to cause a correction in a plurality of intensity tones for a plurality of reticle pattern and defect types. In another aspect, the pupil filter is configured to provide phase contrast in the output beam so as to cause a plurality of focus offsets for a plurality of defects types to be substantially equal.

In other embodiments, the invention pertains to an inspection system for inspecting an EUV reticle. The system includes a light source for generating an incident beam, illumination optics for directing the incident beam onto an EUV reticle, collection optics for directing an output beam that is reflected and/or scattered from the EUV reticle in response to the incident beam, a sensor for detecting the output beam and generating an image or signal for the output beam, and a controller that is configured to perform one or more of the above methods.

These and other aspects of the invention are described further below with reference to the figures.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known component or process operations have not been described in detail to not unnecessarily obscure the present invention. While the invention will be described in conjunction with the specific embodiments, it will be understood that it is not intended to limit the invention to the embodiments.

Figure 1:
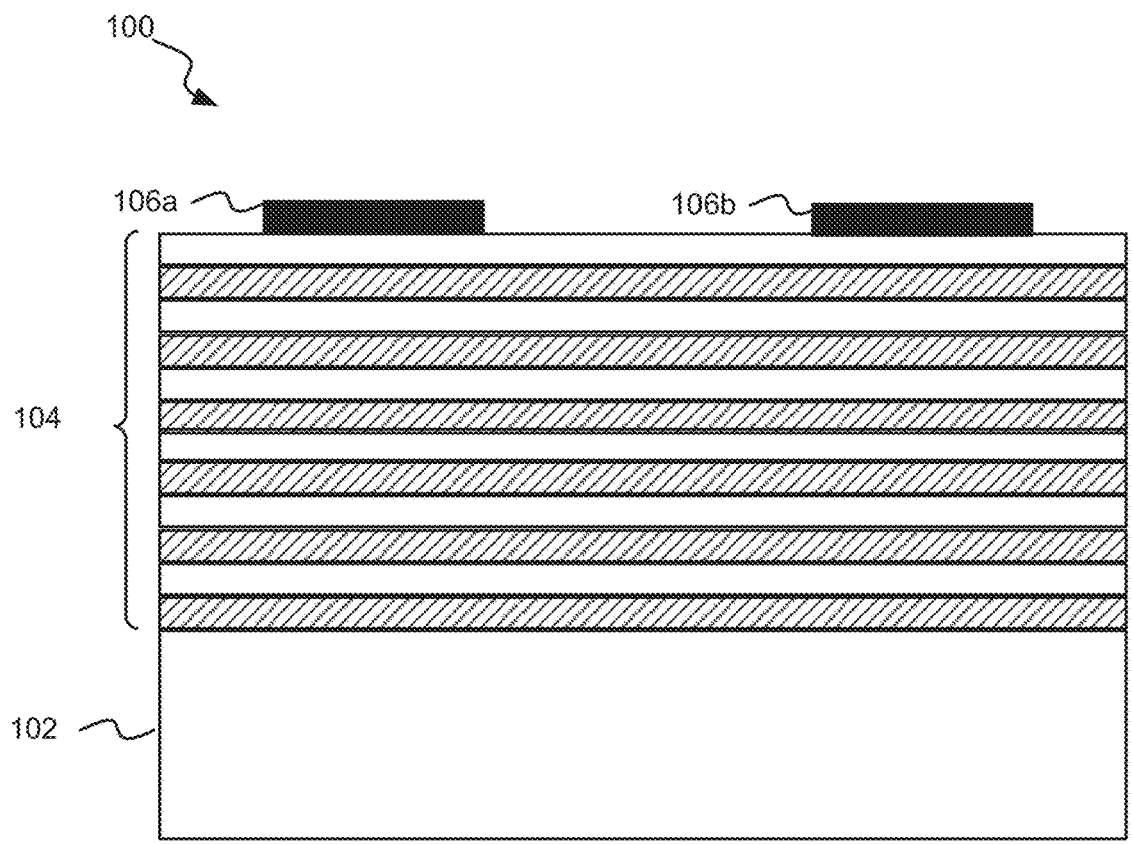
FIG. 1 is a diagrammatic representation of a side view of an example EUV reticle.

An extreme ultraviolet (EUV) lithography process typically uses an EUV type reticle that is designed to facilitate patterning on a wafer at EUV wavelengths, such as 13.5 nm. FIG. 1 is a diagrammatic representation of a side view of a portion of an example EUV reticle. As shown, the EUV reticle 100 may include a substrate 102, such a low thermal expansion (LTE) or ultra-low expansion (ULE) glass plate, such as fused silica.

The substrate is covered with multiple layers 104 of materials to provide moderate reflectance (e.g., 60-70% or more) at the EUV wavelength for performing lithographic exposure at EUV wavelengths. The multilayer (ML) stack 104 serves as a Bragg reflector that maximizes the reflection of EUV radiation while being a poor absorber of the EUV radiation. Reflection generally occurs at interfaces between materials of different indices of refraction with higher differences causing more reflectivity. Although indices of refraction for materials exposed to wavelengths that are extremely low are about equal to 1, significant reflection can be achieved through use of multiple layers having alternating layers of different refractive indices. The ML stack may also be comprised of low absorption characteristics so that the impinging radiation is reflected with little loss. In certain embodiments, the multiple layers 104 include between about 30 to 40 (or 40 to 50) alternating pairs of molybdenum (Mo) and silicon (Si) layers arranged with about 7 nanometer pitch. Other suitable layers may include alternating layers of $Mo_2C$ and Si, Mo and beryllium (Be), molybdenum ruthenium (MoRu) and Be.

The multiple layers 104 may include a capping layer, such as Ru, to prevent oxidation. In other embodiments, an EUV reticle may include a quartz, antireflective coating (ARC), and other features. A pattern (e.g., 106a and 106b) is formed in an absorber layer that is disposed over the multiple layers 104. For example, a tantalum boron nitride (TaBN) film topped by a thin anti-reflective oxide, such as tantalum boron oxide (TaBO), acts as an EUV absorber. The material(s) used for the reticle pattern may be selected to have nearly zero etch bias so as to achieve ultra-fine resolution features.

Figure 2:
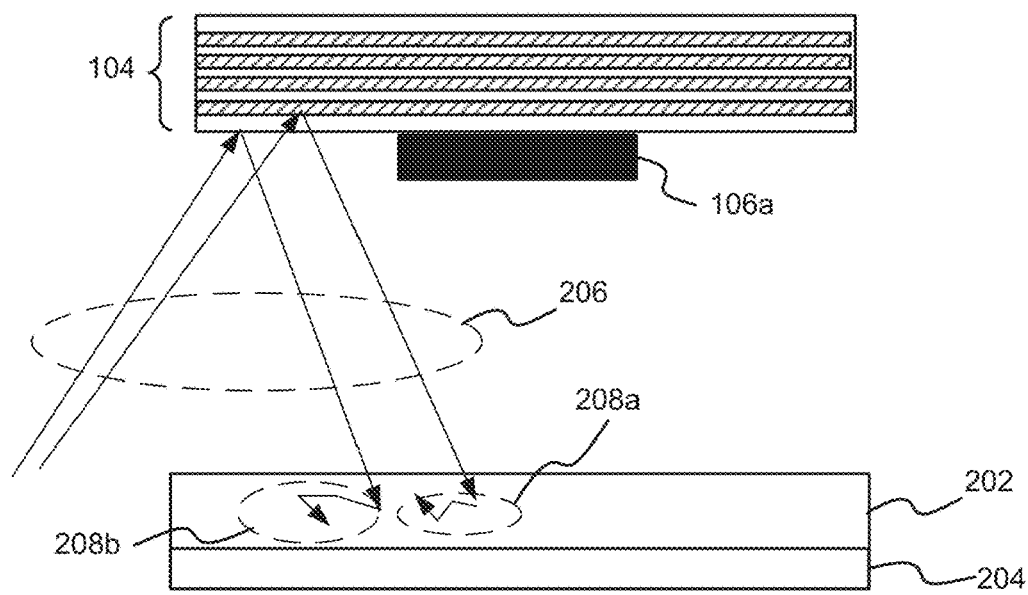
FIG. 2 illustrates a side view perspective of an EUV reticle and wafer in an EUV photolithography process.

In general, any suitable EUV photolithography process may be implemented to expose a photoresist layer on a wafer via an EUV reticle. FIG. 2 illustrates a side view perspective of a reticle and a wafer sample in an EUV photolithography process. The light source of a photolithography system may produce any suitable radiation that is suitable for use with EUV reticles. For instance, EUV wavelengths between about 11 to 14 nm or lower soft x-ray wavelengths may be utilized. In a specific implementation, a wavelength of about 13.5 nm is produced.

During photolithography, radiation 206 that is reflected from the multiple layers 104 of an EUV reticle is absorbed in a resist layer 202 formed on a wafer substrate 204. The absorbed radiation produces photoacids (H+) and amplified photoacids (e.g., 208a and 208b) that form an exposed pattern in the resist layer 202 of the wafer substrate 204 that corresponds to the absorber pattern layer, e.g., 106a, of the EUV reticle when the photo resist is developed. Reflective imaging optics between the EUV reticle and the wafer is omitted in FIG. 2 for clarity.

The defectivity control of the EUV photomasks, which defines the patterns printed on silicon wafers, plays a critical role from a process yield management perspective. However, defect detection has been regarded as one of the high risk areas of EUV lithography development due to the lack of an actinic EUV photomask inspector that optically inspects the photomask at the same wavelength as the EUV scanner uses (e.g., 13.5 nm). Electron-beam inspection tools, which potentially can offer a good sensitivity, typically have an inspection throughput that is orders of magnitude slower than what is desired and is, therefore, not a practical solution for full mask inspection. Currently, and for the foreseeable future, the inspection of patterned EUV photomasks has to rely on the more available, higher throughput inspection tools operating within the deep-UV (DUV) wavelength range (1.90-260 nm).

Such dramatic difference in wavelengths between the inspection and lithography tools has a significant impact on the performance of a DUV inspection tool as applied to EUV photomask defect detection. For instance, the DUV inspection tool has an interior optical resolution as compared to the EUV lithography scanner, resulting in a lower image contrast of the defects of interest. Additionally, the different materials from which the EUV photomask (e.g., ML background materials vs. absorber material pattern) is composed have drastically different optical properties between EUV and DUV wavelengths, which greatly influences the amplitude and phase of the light reflected from the EUV photomask. In a more specific and typical example, the defect sensitivity may be compromised because the light scattered from the detect tends to be out of phase with the light reflected from the background pattern. Such effect has been a major limiting factor in determining the achievable EUV photomask detect detection sensitivity of the DUV inspection tools.

Certain embodiments of the present invention provide apparatus and techniques for significantly improving the EUV photomask detect sensitivity of the DUV inspection tools by utilizing phase contrast imaging in reflection mode. In one example, phase contrast imaging can be implemented on a DUV inspection tool, such as the Teron™ 6xx inspection tools available from KLA-Tencor of Milpitas, Calif., by inserting an optical filtering device in the imaging pupil of such tool. The phase contrast imaging is generally based on reflected light since EUV masks tend not to be transparent to DUV light.

Although the intensity levels are similar for light reflected from ML and defect materials on the mask, the ML is typically beneath the defect or absorber pattern so that it reflects light back at a different phase than the defect or absorber layer. This phase difference can cause a reduction in defect signal strength, but can also be leveraged in a phase contrast imaging process to enhance one signal over the other for improved contrast results, which also improves defect detection.

Figure 3:
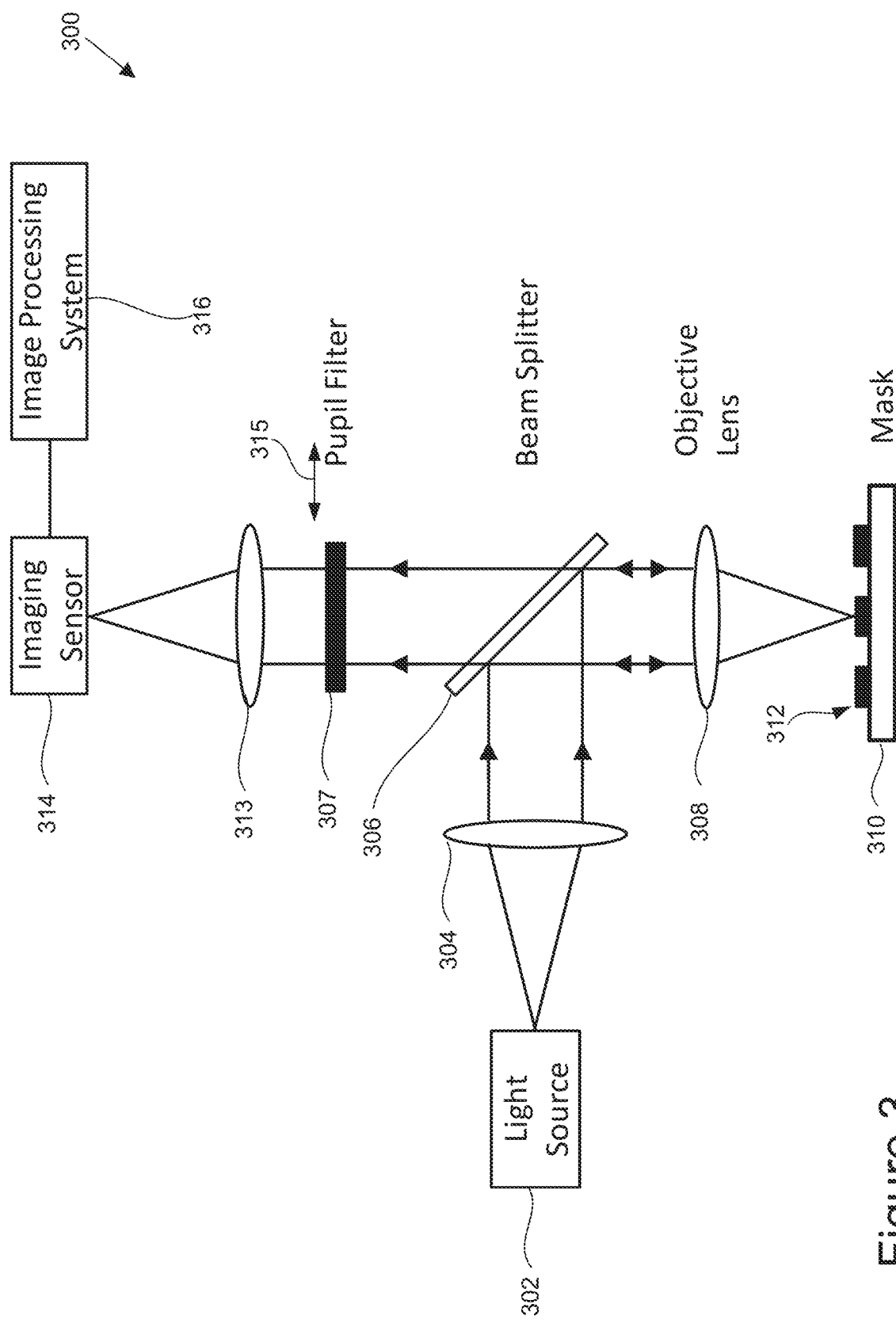
FIG. 3 is a diagrammatic representation of an inspection system that is configured for phase contrast imaging in accordance with one embodiment of the present invention.

Any suitable combination of hardware and software may be used to implement phase contrast for reticle inspection. FIG. 3 is a diagrammatic representation of an inspection system 300 that is configured for phase contrast reflective imaging in accordance with one embodiment of the present invention. This system 300 generally includes a light source 302 that is suitable for inspection of an EUV reticle. One example of a light source is a quasi-continuous wave laser. In certain embodiments, a light source may generally provide high pulse repetition rate, low-noise, high power, stability, reliability, and extendibility. It is noted that while an EUV scanner operates at 13.5 nm wavelength, an inspection tool for an EUV reticle does not have to operate at the same wavelength. A Teron™ system from KLA-Tencor, for example, operating at 193 nm can be used to inspect EUV reticles.

The inspection tool can generally be set up with a set of operating parameters or a "recipe". Recipe settings may include one or more of the following settings: pupil filter configuration, zoom settings, one or more defect detection threshold values, a focus setting, an illumination or detection aperture setting, an incident beam angle and wavelength setting, a detector setting, a setting for the amount of reflected or transmitted light, aerial modeling parameters, etc. Certain embodiments of the present invention utilize an inspection system in reflection mode and having a set polarization, such as S, P, circular, etc.

An inspection system includes a collection of optical elements for focusing an illuminating light beam onto the inspected surface 312. For instance, the system 300 may include a beam steering device for precise beam positioning and a beam conditioning device, which can be used to provide light level control, speckle noise reduction, and high beam uniformity. Beam steering and/or beam conditioning devices may be separate physical devices from, for example, a laser. For brevity, FIG. 3 illustrates only a condenser lens 304, a beam splitter 306, and an objective lens 308 for the illumination optics. However, one skilled in the art would understand that an inspection system can include other optical or electronic elements for achieving specific inspection functions. The objective lens 308 may be relatively large in order to meet specific low aberration requirements. The objective lens can be adjusted to different sizes of pixels, e.g., less than about 100 nm for each pixel or, more particularly, less than about 75 nm or even less than 60 nm.

The sample 310 may also be placed on a stage (not labeled) of the inspection system 300, and the inspection system 300 may also include a positioning mechanism for moving the stage (and sample) relative to the incident beam. By way of examples, one or more motor mechanisms may each be formed from a screw drive and stepper motor, linear drive with feedback position, or band actuator and stepper motor.

After the incident beam(s) impinge on the sample 310, the light may then be reflected and diffracted/scattered from the sample 310 in the form of "output light" or an "output beam." The inspection system also includes any suitable lens arrangements for directing the output light towards one or more detectors. As shown, an output beam can be received by a detector or imaging lens 313, which directs the output beam towards a detector or imaging sensor 314. In certain embodiments, the sensor 314 is a time delay integration (TDI) detector. A typical TDI detector accumulates multiple exposures of the same area of the inspected surface, effectively increasing the integration time available to collect incident light. In general, a sensor or detector may include transducers, collectors, charge-coupled devices (CCDs), or other types of radiation sensors.

When imaging the reticle, one can analyze the light from both the ML and absorber materials. For instance, the Kirchhoff complex reflection coefficients at 193 nm wavelength for both the ML and absorber can be calculated. This calculation shows that the absorber has a reflection amplitude approximately half of that of the ML and that there is a −90° phase angle difference between them, indicating that the EUV mask is a strong phase object. It should be noted that the EUV absorber stack film thickness and type could vary in practice. The phase nature of the mask generally persists with certain variability in the exact phase angle.

Given a mask pattern M, the mask optical near field E under the illumination of a single coherent plane wave can be considered within the Kirchhoff approximation, which could be written as:

$$E(\vec{x}) = (r_{ML} - r_{abs}) \times M(\vec{x}) + r_{abs} \quad \text{Equation [1]}$$

where $r_{ML}/r_{abs}$ represents the Kirchhoff complex reflection coefficients for the ML and absorber, respectively. M represents the mask binary pattern, which is defined as:

$$M(\vec{x}) = \begin{cases} 1 & \text{when } \vec{x} \text{ is on ML} \\ 0 & \text{when } \vec{x} \text{ is on absorber} \end{cases} \quad \text{Equation [2]}$$

Under the Fresnel diffraction theory, when the mask near field propagates to the far field pupil plane of the objective lens, the optical field at the far field pupil plane $\hat{E}(\hat{k})$ can be simply described as the Fourier transform of the mask near field $E(\vec{x})$ as:

$$\hat{E}(\vec{k}) = (r_{ML} - r_{abs}) \times \hat{M}(\vec{k}) + r_{abs}\delta(\vec{k}) = (r_{ML} - r_{abs}) \times$$
$$\hat{M}(\vec{k} \neq 0) + [(r_{ML} - r_{abs}) \times \overline{M} + r_{abs}]\delta(\vec{k}) \quad \text{Equation [3]}$$

The variable $\vec{k}$ is the angle of incidence, with $\vec{k}=0$ being a normal angle. A nonzero $\vec{k}$ corresponds to light scattered from the mask, while a change in $\vec{k}$ corresponds to difference between reflection angle and scattered angle. $\delta(\vec{k})$ is the Dirac delta function. The first term on the right is the diffracted field from the mask, while the second term is the reflected field from the mask. It can be seen that the relative phase angles between the diffracted orders are determined by $\hat{M}$, similar to a binary mask. However, the phase of the reflected field is generally different from the diffracted field, depending on the pattern layout. Now let's consider a special use case that is of particular interest for early adoption of EUV technology, e.g., an EUV mask to print contact and via patterns. In this case, the mask is a dark-field mask which is mostly covered by absorber with small contact holes in it. Also, since $|r_{ML}| \gg |r_{abs}|$, the pupil field can be simplified as:

$$\hat{E}(\vec{k}) \approx r_{ML}\hat{M}(\vec{k} \neq 0) + r_{abs}\delta(\vec{k}) = r_{ML}\left[\hat{M}(\vec{k} \neq 0) + \frac{r_{abs}}{r_{ML}}\delta(\vec{k})\right] \quad \text{Equation [4]}$$

The above indicates that the reflected field carries a phase different from the diffracted field by $r_{abs}/r_{ML}$, or close to −90° for the stack shown in FIG. 1, which could lead to a reduced pattern image contrast under the conventional imaging mode. To correct this, one could implement a phase filter in the pupil plane that is designed or configured for adding a +90° phase to the reflected field, which can be designed to improve the contrast of the resulted image. Thus, a phase filter can be arranged or designed to introduce an additional phase difference, such as 90°, between the light reflected and scattered from a phase object, which has a phase difference already present between its reflected and scattered light, to enhance the signal from the phase object in contrast to non-phase or differently phased objects, for example. One way is to provide a change in phase so that the phases between the scattered and reflected light from a phase object are more closely matched and can constructively interfere with each other to enhance the phase object's detected image signal relative to other non-phase or differently phase reticle portions or objects.

Figure 4A:
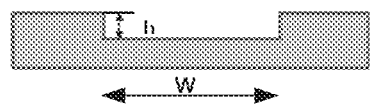
FIG. 4A is a diagrammatic representation of a side view of a pupil filter in accordance with one embodiment of the present invention.

In the illustrated example of FIG. 3, the system 300 includes a pupil filter 307 to provide phase contrast for the output light. The pupil filter 307 may be fabricated by etching into a thin slab of glass, such as fused silica. FIG. 4A is a diagrammatic representation of a side view of a pupil filter in accordance with one embodiment of the present invention. The etch depth or height h determines the phase of the filter relative to the unetched area. At 19.3 nm, an etch depth of approximately 85 nm would give a phase angle close to 90°.

The geometry of the pupil filter is configured to match the shape of the illumination aperture. That is, the pupil filter is configured to provide a phase change within the illumination area, which also corresponds to a reflected portion of the output light, while not providing a phase change outside such illumination area, which corresponds mostly to the scattered light. For example, if sigma 0.5 illumination is used, the pupil filter can be a circular disk with an etched portion having a diameter approximately half of the pupil imaging aperture diameter. In the example of FIG. 4A, the width of the etched portion, w, can be sized to match the aperture diameter, such as a sigma 0.5 aperture. The sigma 0.5 illumination and circular polarization is chosen here as an example to illustrate the impact of the phase contrast imaging. It should by no means be considered as the only illumination option for EUV photomask inspection.

Figure 4B:
FIG. 4B is a diagrammatic representation of a side view of a pupil filter having half-tone metallic patterns for controlling transmission in accordance with an alternative embodiment of the present invention.

Anti-reflection coating (such as $MgF_2$, etc.) may be deposited on one or both sides of the glass to reduce stray light. The transmission of the filter is typically left unchanged, but it may also be controlled by putting half-tone metallic or other partially transmissive patterns on the flat side of the glass, made by material compatible with DUV light, such as chrome, aluminum or nickel. FIG. 4B is a diagrammatic representation of a side view of a pupil filter having half-tone metallic patterns 404 for controlling transmission in accordance with an alternative embodiment of the present invention. The half-tone patterns can vary in size and spacing so as to change the amount of light that is transmitted through the filter as needed for further improving the defect detection sensitivity for certain defect types or mask pattern types.

Figure 5:
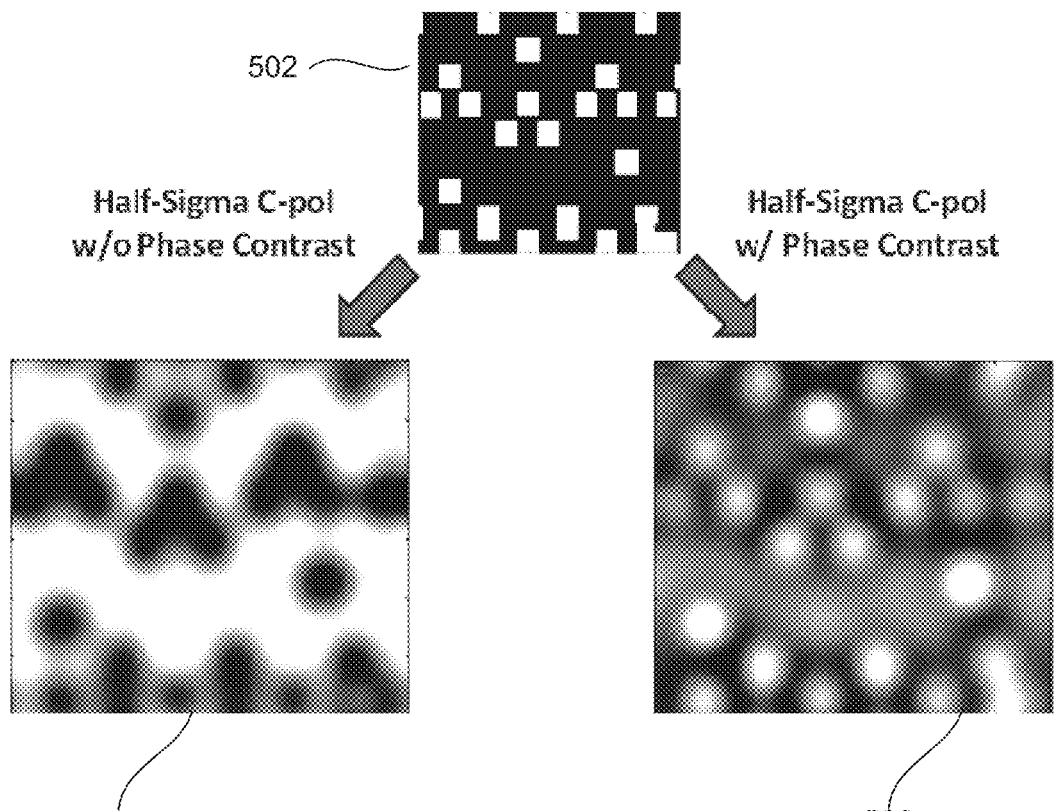
FIG. 5 shows the simulated images at best focus of a typical EUV contact mask pattern, under half-sigma illumination with circular polarization, with and without phase contrast.

To show the impact of phase contrast imaging on the relative defect sensitivity of EUV mask inspection, rigorous optical simulations have been performed to model the images of EUV mask pattern and various defects that would be generated by the Teron™ 6xx inspection tool from KLA-Tencor, with and without phase contrast. FIG. 5 shows the simulated images at best focus of a typical EUV contact mask pattern 502, under sigma 0.5 illumination with circular polarization, with and without phase contrast. Due to the phase nature of the mask, the image without phase contrast shows a contrast reversal as shown by image 504. The contact holes, which correspond to the exposed ML area with higher reflectivity, appear darker in the image without phase contrast (504). The contacts that are close to each other are also poorly resolved. With phase contrast, on the other hand, the resulting image 506 shows the correct image tone. Each individual contact is also better resolved.

Figure 6:
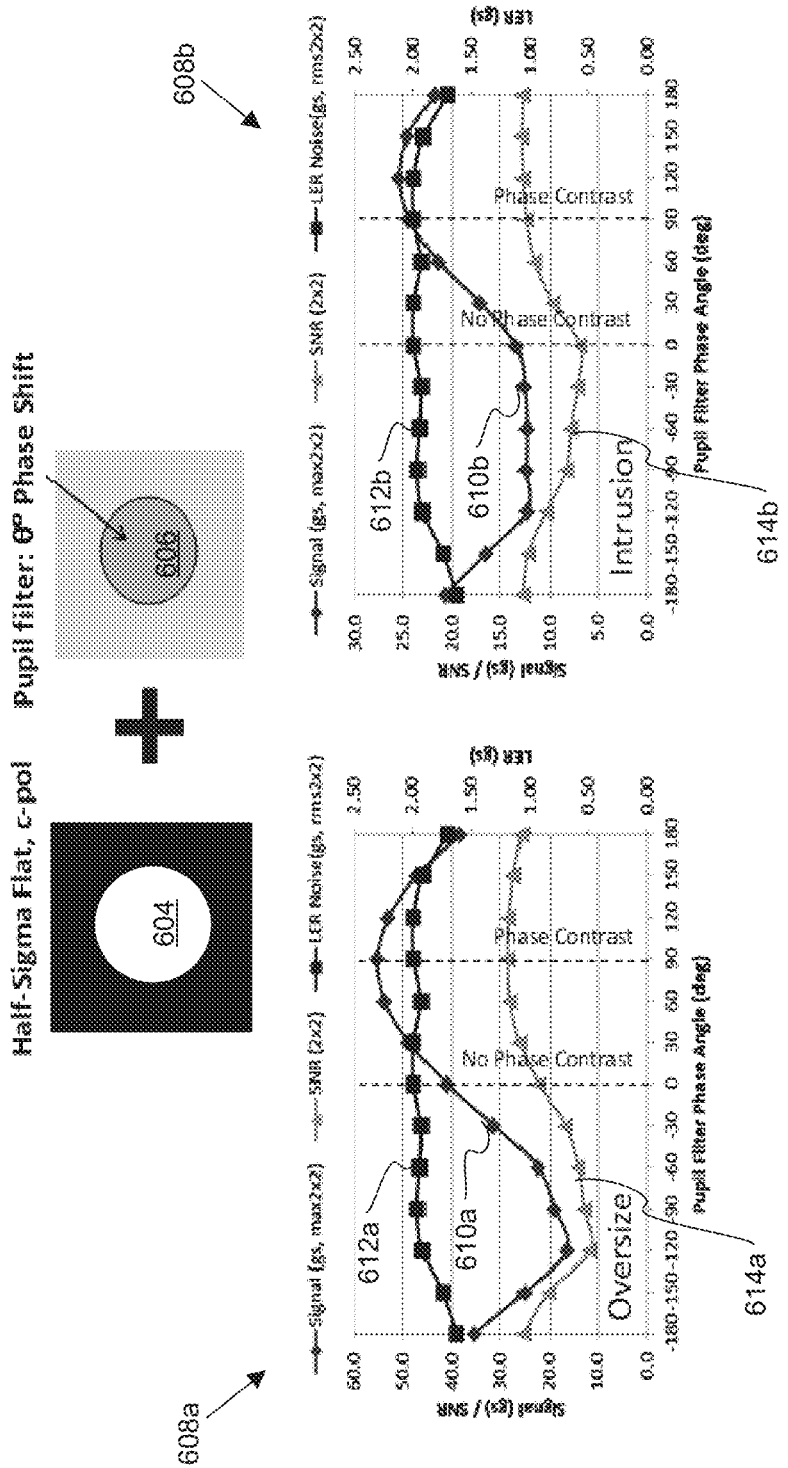
FIG. 6 includes graphs that each illustrate a calculated defect signal for oversize and intrusion defects on an EUV mask as a function of the phase angle of the pupil filter in accordance with a specific application of the present invention.

An oversize defect is a contact that is larger than intended, and an intrusion type defect has additional absorber present so that the via is incomplete. FIG. 6 includes graphs that each illustrate calculated defect signals for oversize and intrusion defects on an EUV mask as a function of the phase angle of the pupil filter in accordance with a specific application of the present invention. The optimal phase angle (Θ) of the pupil filter (606) that is positioned at the pupil (604) may be designed and determined in any suitable manner for any defect type, defect composition, reticle type, and reticle composition. In general, the pupil filter is designed to provide phase contrast for the entire illuminated area. For instance, if the illumination profile is circular, elliptical, or ring shaped, the pupil filter has a phase change area that is similarly circular elliptical, or ring shaped, respectively. The reason is that when light is reflected from an EUV mask, the mask pattern and any defects will tend to scatter/diffract light so as to fill (in addition to the reflected light) the whole pupil area.

Specifically, FIG. 6 shows defect intensity signals that are simulated as a function of the pupil filter phase angle for oversize and intrusion defect types, respectively, as curves 610a and 610b. The graphs 608a and 608b illustrate signal to Noise Ratio (SNR) values 614a and 614b, respectively, for oversize and intrusion defects. The graphs 608a and 608b also show line edge roughness (LER) noise signals 612a and 612b, respectively, for oversize and intrusion defects. It has been found that LER tends to remain the same with phase changes.

The phase angle of 0 degrees corresponds to the case of no phase contrast imaging. As seen for both an oversize contact defect and intrusion defect, a phase angle close to 90° is close to optimal in order to maximize the defect signal (610a and 610b). Although the defect signal 610b for the intrusion defect is greater than the LER roughness 612b, a phase angle of around 130° seems to result in an even stronger defect signal 610b and that is well above the LER noise 612b so that 130° may be selected for such defect type.

Figure 7:
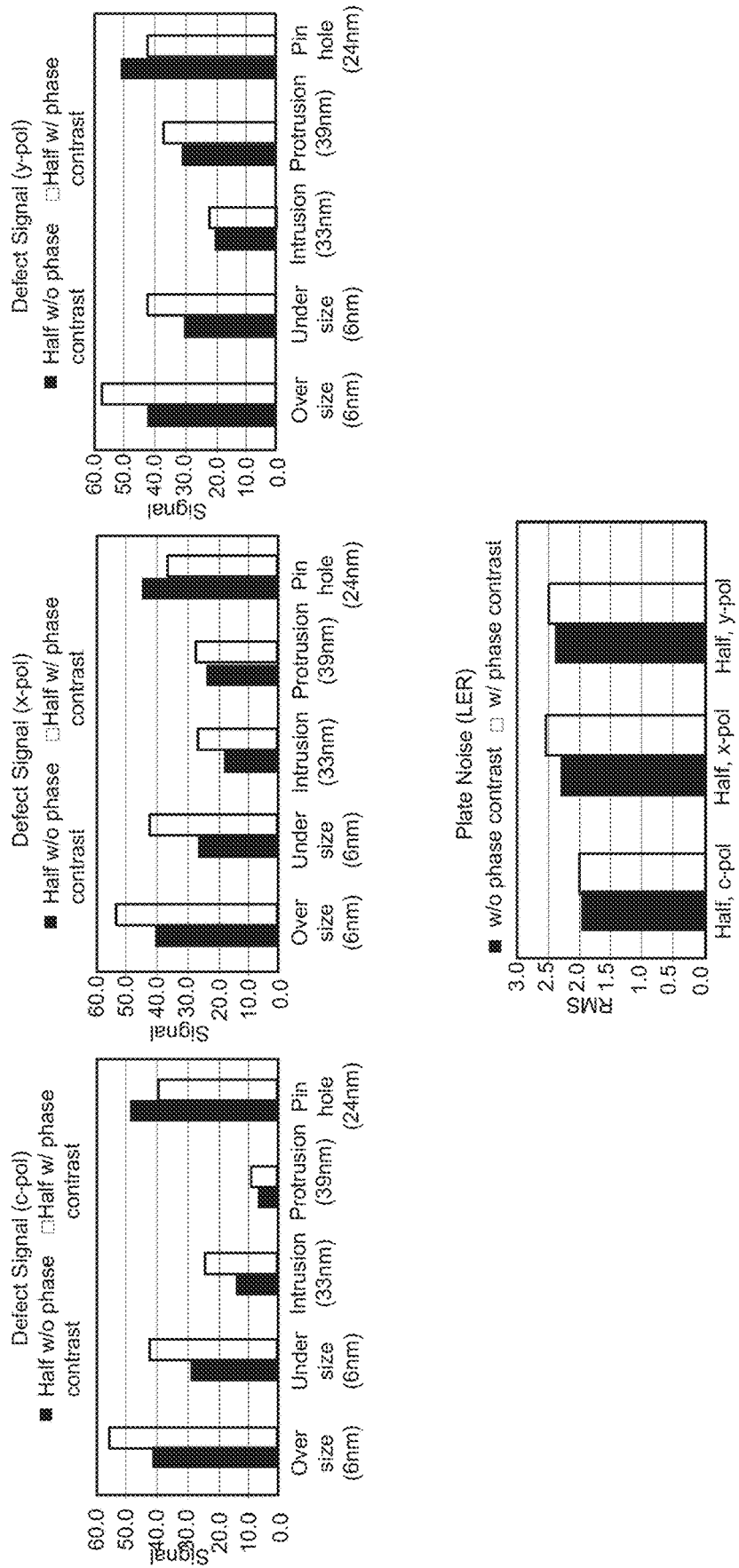
FIG. 7 shows bar graphs for an expanded list of defects that are simulated with and without application of a phase contrast technique under three different illumination polarization conditions.

FIG. 7 shows bar graphs for an expanded list of defects that are simulated with and without application of a phase contrast technique under three different illumination polarization conditions. As shown, the phase contrast can give an enhancement to the signal of oversize, undersize, intrusion, and protrusion defects under many different polarization conditions. The biggest signal improvement is seen for undersize and intrusion, which can have an improvement of 50-80%.

The pinhole defect is an exception to this improvement, and is likely caused by its unique geometry, which gives it a somewhat different phase signature than the other defect types. Phase contrast imaging generally leads to a reduction of defect signal for pinhole defect.

Accordingly, the pupil filter can be configurable to different phase change values. For instance, different pupil filters with different etched depths. and resulting phase change values can be selectively inserted into the imaging pupil plane along directions 315, as well as removing all pupil filters from the pupil plane for an inspection without phase contrast, e.g., for pinhole defect detection.

Certain embodiments of the current invention may also include the implementation of multiple pupil filters on a given inspection system. The choice of which particular pupil filter is used in an inspection pass depends on the specifics of the EUV mask stack and defect types to be detected. Multiple inspection passes, each performed with a different pupil filter, may be initially performed in order to achieve the optimal overall inspection sensitivity for all critical detect types. A set of pupil filters can be provided in the imaging path. During the inspection, while a particular swath N is being processed, a computer node can analyze the database corresponding to swath N+1 and recommend the best pupil filter for that swath. The filter may be selected for optically scanning swath N+1. That is, a filter may be selected for a next swath based on the results of using one or more (or multiple) pupil filters on a current or previous swath or other reticle area.

The pattern line edge roughness (LER) noise has been found to be the dominant source of plate noise in EUV masks. Simulations of how LER noise responds to phase contrast imaging are also shown in FIG. 7. Interestingly, LER noise is rather insensitive to phase contrast imaging. As a result, the defect signal to noise ratio (SNR) may be greatly improved with the use of contrast imaging, leading to higher defect sensitivity.

Figure 8:
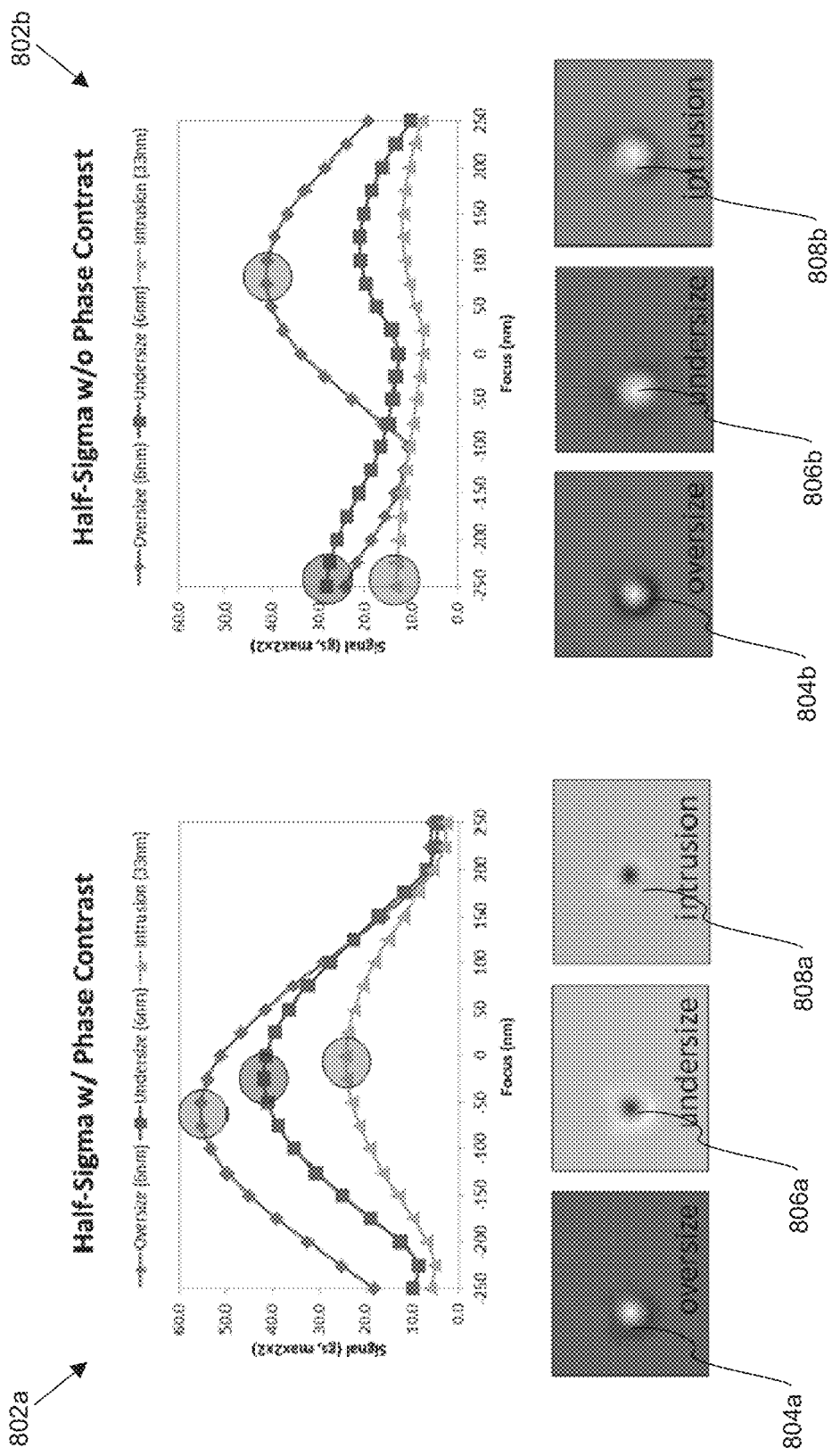
FIG. 8 shows the signals for oversize, undersize and intrusion defects through focus with and without phase contrast.

Phase contrast imaging can also improve the optical performance of the inspection tool when inspecting an EUV mask. FIG. 8 shows the signals for oversize, undersize and intrusion defects through focus and with and without phase contrast. Generally speaking, it is preferable to operate the inspection tool at the focus offset that maximizes the defect signal. However, it can be seen in graph 802b that the best focus positions for the three defects differ dramatically without phase contrast.

It may often be impossible to find a single focus offset that gives the best signal for all defects without use of phase contrast imaging. In this situation, a multi-pass inspection with different focus offsets may be used, compromising the inspection throughput. With phase contrast, however, not only are the defect signals enhanced, but the best focus positions for all three defects are aligned to be within 50 nm from each other as shown in graph 802a, allowing a single-pass inspection to capture all three defect types. In another example, all three defects are aligned to be within 70 nm from each other.

Another advantage of the phase contrast imaging relates to defect classification, which relies on the information contained in the defect residual image. For example, for a EUV contact pattern, an oversize detect will tend to have a bright tone (804a), while an undersize or an intrusion defect (806a and 808a) tend to have a dark tone. As also seen in FIG. 8, the defect intensity tone at the best focus is incorrect for undersize (806b) and intrusion (808b) without phase contrast, but is correct with phase contrast (806a and 808a). It is noted that the defect intensity tone for oversize with phase (804a) and without phase (804b) are correct. Thus, phase contrast imaging will likely provide a more accurate defect classification result since the intensity tone is correct for all defect types.

Lastly, phase contrast imaging is compatible with both die-to-die and die-to-database inspection modes. In die-to-database inspection, the defect-free reference image may be generated by calculating the optical image based on the mask design database input by simulating fabrication and inspection tool effects for fabricating and imaging a reticle that would be formed from the design database. For an accurate rendering, the optical condition of the inspection tool needs to be taken into account. The Partial Coherent Model (PCM) of the 6xx DB rendering algorithm available from KLA-Tencor is configured for handling phase contrast imaging by providing a specific pupil function for the model.

Figure 9:
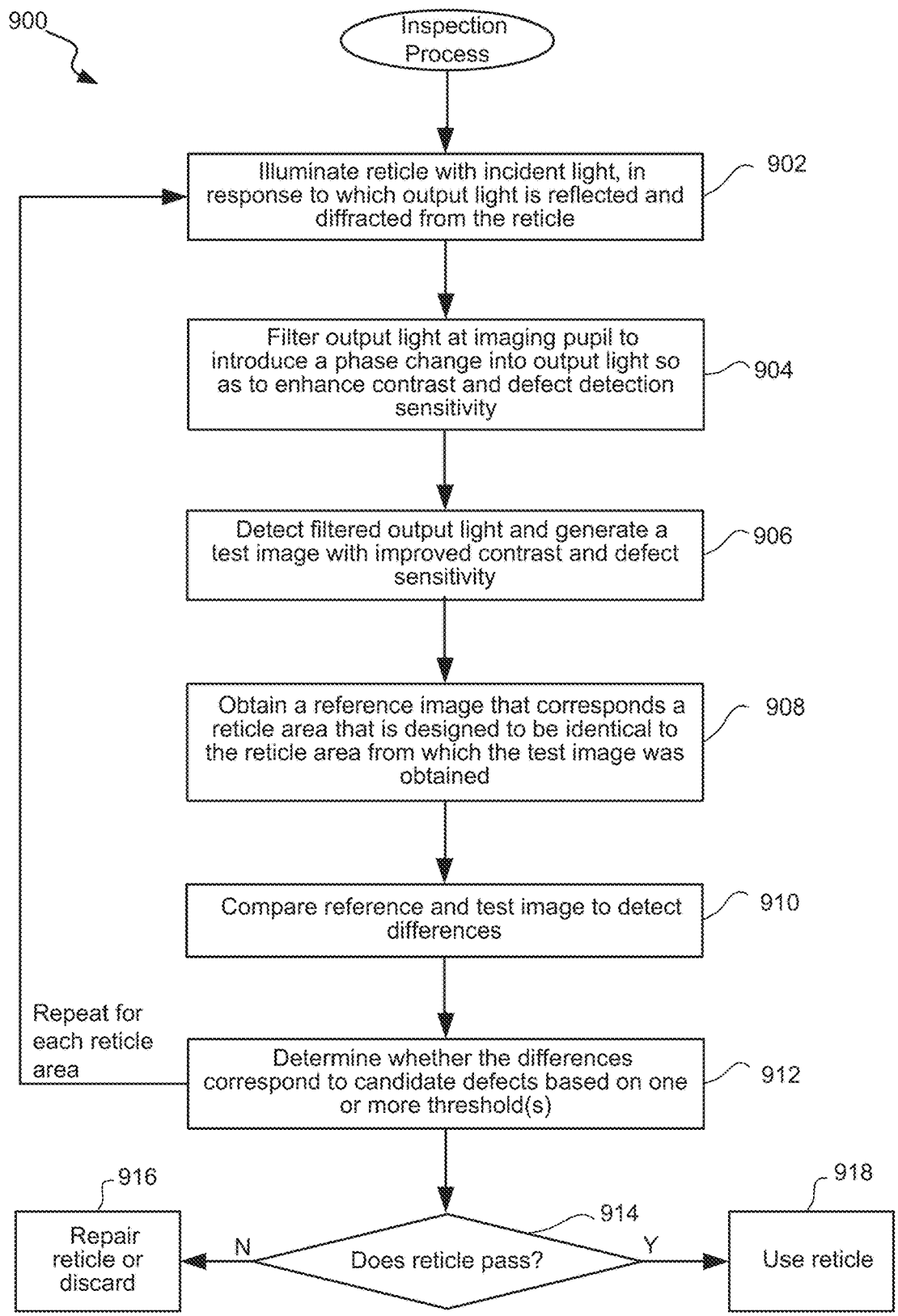
FIG. 9 is a flow chart illustrating an inspection process with phase contrast in accordance with one embodiment of the present invention.

Any suitable technique may be utilized for implementation of phase contrast for increased defect sensitivity, as well as other benefits as described herein. FIG. 9 is a flow chart illustrating an inspection process 900 with phase contrast in accordance with one embodiment of the present invention. Initially, a reticle is illuminated with incident light, in response to which output light is reflected and diffracted from the reticle, in operation 902. For instance, the reticle is loaded into an inspection tool that operates in the deep ultraviolet (DUV) range (190-260 nm) and is configured in reflection mode. One example inspection tool is described with respect to FIG. 3. For implementation of the phase contrast techniques described herein, the reticle generally has strong phase characteristics. For instance, the ML and absorber pattern will tend to have a significant phase angle difference between them, such as 90°, so that image contrast between the pattern/defect and background is poor without correction. The EUV reticle will also tend to have pattern geometries that are comparable or smaller than the wavelength of the inspection tool. It should be noted that the EUV absorber stack film thickness and type (and defect material type) could vary in practice, and the phase nature of the mask generally persists with certain variability in the exact phase angle difference.

The output light may then be filtered at the imaging pupil to introduce a phase change in the output light so as to enhance contrast and defect detection sensitivity in operation 904. For example, a Zernike phase filter is positioned in the pupil plane to add a 90° phase to the reflected field so as to improve the contrast of the resulting image. That is, the pupil filter applies a phase change to light transmitted therethrough. Similar correction could also be applied to improve the image contrast of a mask pattern detect that carries a strong phase signature relative to the background pattern and, hence, achieve a better detect sensitivity.

An alternative way to implementing a pupil filter for phase contrast imaging on an imaging system is to introduce a large spherical aberration in such system. This spherical aberration may be introduced by changing the position of the zoom lens group along the iso-magnification curve in conjunction with a shift of the best focus position of the imaging system, which can be configured on the 6xx Teron system available from KLA-Tencor. This alternative method does not require physically inserting a pupil filtering device in the imaging pupil. However, the defect sensitivity improvement gained this way will not be as significant as with use of the pupil filtering device. Accordingly, this aberration technique may be combined with use of a pupil filter for further phase contrast.

Referring back to the illustrated example of FIG. 9, the filtered output light may then be detected and a test image with improved contrast and defect sensitivity generated in operation 906. A reference image that corresponds to an identical area of the reticle may also be obtained in operation 908. The reference image may be obtained from an identical die or rendered from the design database's design description that was used to fabricate the imaged reticle portion. For instance, a model simulates a reticle pattern image by simulating a process for altering the design data patterns in a same way as such design patterns are altered to form the actual test reticle, e.g., corners of the design polygons are rounded, etc. The model also simulates a reference image that is generated from such simulated reticle pattern by modeling the particular inspection tool to generate a test image from the actual test reticle. More specifically, the model simulates how light is reflected and/or diffracted from the simulated reticle and detected by the inspection tool's optics and sensor and simulates a reference image based on such detected light. Example modeling software for reticle fabrication simulation and inspection tool simulation are PROLITH™ available from KLA-Tencor of Milpitas, Calif.

The reference and test images may then be compared to detect defects in operation 910. For instance, the test image may be subtracted from the reference image to obtain a difference image. In one example, the intensity values from each image pixel can be subtracted. In another example, two intensity averages for the pixels in each pair of images that represent multiple pixels are compared or subtracted. Regardless of the technique used to compare the test and reference images, difference image portions may be referred to as "events".

It may then be determined whether the differences or events correspond to candidate defects based on one or more threshold(s) in operation 912. Any suitable type and number of defect analysis may be performed on the difference image portions to detect candidate defects. For instance, desense processing may optionally be performed on each event. In a desensing process, a less stringent (or different) threshold or algorithm may be used to determine whether each event is a defect for one or more predefined areas or feature types of the reticle that have been identified as being less sensitive to false defects/artifacts, as compared to other areas or feature types that are more sensitive to false defects. In one example, a user may have set up a recipe to analyze different reticle areas or types of features (e.g., edges, etc.) in a different manner, such as using different thresholds.

A defect report for the candidate defects may also be generated and stored. The defect report may be in any suitable format. In one implementation, the defect report may contain a reference to an image and location for each candidate defect. It is noted that the defect report may contain a difference between the test and reference images for each candidate defect. An image and location of each candidate defect may also be stored with the defect report for later review. In another example, the detect report is in the form of an image comprised of intensity differences that were defined or flagged as potential defects. The report may be in the form of a defect map having varying colors that correspond to varying intensity or average intensity differences for the candidate defects as further described below.

It is noted that the operations 902~912 may be repeated for each reticle area so that the entire reticle is inspected. After the reticle is inspected, it may then be determined whether the reticle passes inspection in operation 914. For instance, each image difference or intensity value difference that is above a predefined threshold may then be more carefully reviewed to determine whether the reticle is defective and can no longer be used. For instance, a SEM may be used to review each detect candidate to determine whether critical dimensions (CD's) are out of specification. This review process may be implemented on any or all of the reported candidate defects.

Regardless of the inspection approach that is implemented, if the reticle does not pass review, the corresponding reticle can either be repaired or discarded in operation 916 and the inspection ends. For instance, certain defects can be cleaned from the reticle. The photolithography process may also be adjusted based on a delta intensity map. In one implementation, the delta value, $\Delta I/I$ may be correlated to a fractional dose correction, $\Delta D/D$, by $\Delta I/I = -\Delta I)/I)$. Dose correction based on intensity variation may be determined by the DoseMapper™ methodology available from ASML of Veldhoven, the Netherlands or the CDC correction methodology available from Zeiss of Germany.

If the reticle passes, the review process may end without discarding or repairing the reticles. The passing reticle may be used to fabricate wafers in operation 918. After a reticle (repaired or passing reticle) is again used, the reticle may again be inspected.

In an alternative embodiment, if the reticle passes inspection, all the candidate defects can be deemed "acceptable differences", and such acceptable difference values can be stored and later reused to quickly requalify the reticle after such reticle has been used. In this example, the "acceptable differences" are used as a set of baseline events. If such baseline events are present on a used reticle, such baseline events can be deemed acceptable and not reported as candidate defects. Only differences that have occurred since the baseline events were detected are determined to be candidate defects and subject to defect review.

Referring back to the system of FIG. 3, the illumination beam may be directed towards the sample surface 312 at a substantially normal angle with respect to the inspected surface. In other embodiments, an illuminating light beam can be directed at an oblique angle, which allows separation of the illuminating and reflected beams.

The sensor 314 is typically also coupled with a processor system 316 or, more generally, to a signal processing device, which may include an analog-to-digital converter configured to convert analog signals from the sensor 314 to digital signals or images for processing. The processor system 316 may be configured to analyze intensity, phase, and/or other characteristics of one or more reflected and scattered beams. The processor system 316 may be configured (e.g., with programming instructions) to provide a user interface (e.g., a computer screen) for displaying a resultant test image and other inspection characteristics. The processor system 316 may also include one or more input devices (e.g., a keyboard, mouse, joystick) for providing input. The processor system 316 may also be coupled with the stage for controlling, for example, a sample position (e.g., focusing and scanning), pupil filter configuration, zoom setting, and other inspection parameters and configurations of the inspection system elements. In certain embodiments, the processor system 316 is configured to carry out inspection techniques detailed above. The processor system 316 typically has one or more processors coupled to input/output ports, and one or more memories via appropriate buses or other communication mechanisms.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

It should be noted that the above description and drawings are not to be construed as a limitation on the specific components of the system and that the system may be embodied in many other forms. For example, it is contemplated that the inspection or measurement tool may have any suitable features from any number of known imaging or metrology tools arranged for detecting defects and/or resolving the critical aspects of features of a reticle or wafer. By way of example, an inspection or measurement tool may be adapted for bright field imaging microscopy, dark field imaging microscopy, full sky imaging microscopy, phase contrast microscopy, polarization contrast microscopy, and coherence probe microscopy. It is also contemplated that single and multiple image methods may be used in order to capture images of the target. These methods include, for example, single grab, double grab, single grab coherence probe microscopy (CPM) and double grab CPM methods. Non-imaging optical methods, such as scatterometry, may also be contemplated as forming part of the inspection or metrology apparatus.

In other inspection applications, the incident light or detected light may be passed through any suitable spatial aperture to produce any incident or detected light profile at any suitable incident angles. By way of examples, programmable illumination or detection apertures may be utilized to produce a particular beam profile, such as dipole, quadrapole, quasar, annulus, etc. In a specific example, pixelated illumination techniques may be implemented. Programmable illuminations and special apertures can serve the purpose of enhancing feature contrast for certain patterns on the reticle, in addition to any of the phase contrast techniques described above.

The inspection apparatus may be suitable for inspecting semiconductor devices or wafers and optical reticles, as well as EUV reticles or masks. Other types of samples which may be inspected or imaged using the inspection apparatus and techniques of the present invention include any surface, such as a flat panel display.

In general, an inspection tool may include at least one light source for generating an incident light beam, illumination optics for directing the incident beam onto a sample, collection optics for directing an output beam that is emitted from the sample in response to the incident beam, a sensor for detecting the output beam and generating an image or signal for the output beam, and a controller for controlling the components of the inspection tool and facilitating the inspection techniques as described further herein.

In exemplary inspection systems, the incident beam may be in any suitable form of coherent light. Additionally, any suitable lens arrangement may be used to direct the incident beam towards the sample and direct the output beam emanating from the sample towards a detector. The output beam may be reflected or scattered from the sample or transmitted through the sample. For EUV reticle inspection, the output beam is reflected and scattered from the sample. Likewise, any suitable detector type or number of detection elements may be used to receive the output beam and provide an image or a signal based on the characteristics (e.g., intensity) of the received output beam.

Although the foregoing invention has been described in some detail for purposes of clarity of understanding, it will be apparent that certain changes and modifications may be practiced within the scope of the appended claims. It should be noted that there are many alternative ways of implementing the processes, systems, and apparatus of the present invention. Although the above-described techniques are described with respect to test and reference images, test and reference reticle portions may be represented by a plurality of intensity values and coordinates that were detected for the reticle. Accordingly, the present embodiments are to be considered as illustrative and not restrictive, and the invention is not to be limited to the details given herein.

What is claimed is:

1. A method of inspecting an extreme ultraviolet (EUV) reticle using an optical inspection tool, the method comprising:

using an inspection tool having a pupil filter positioned at an imaging pupil to obtain a test image or signal from an output beam that is reflected and scattered from a test portion of an EUV test reticle, wherein the pupil filter is configured to provide phase contrast in the output beam to enhance a signal from any defects as compared to a signal from noise on the reticle, wherein the pupil filter is designed based on simulated defect intensity signals for a plurality of defect types as a function of a phase change angle produced by a plurality of pupil filter configurations;

obtaining a reference image or signal for a reference reticle portion that is designed to be identical to the test reticle portion;

comparing the test and reference images or signals and determining whether the test reticle portion has any candidate defects based on such comparison;

for each of a plurality of test reticle portions of the reticle, repeating the operations for using the inspection tool, obtaining a reference image or signal, comparing, and determining; and generating a defect report based on any candidate defects that have been determined to be present.

2. The method of claim 1, wherein the pupil filter is configured to provide phase contrast in the output beam so as to enhance a signal strength of a phase object, including a defect, as compared to a non-phase or differently phased object in the test reticle portion.

3. The method of claim 2, wherein the pupil filter is configured to provide phase contrast in the output beam to introduce a phase change so that a phase between light scattered from a phase object more closely matches light reflected from such phase object and such scattered and reflected light can constructively interfere with each other to enhance the phase object's detected image signal.

4. The method of claim 1, wherein the pupil filter is a slab of glass that has an etched portion having an etched depth corresponding to an amount of phase change that is introduced into a portion of the output beam that is transmitted through the pupil filter.

5. The method of claim 4, wherein the etched depth is about 85 nm to provide a phase change of 90°.

6. The method of claim 4, wherein the etched portion of the pupil filter has a width that substantially matches an illumination area, which corresponds to a reflected portion of the output light, so as to provide a phase change for such illumination area and not outside such illumination area, which corresponds to a scattered light portion of the output light.

7. The method of claim 6, wherein the illumination area corresponds to a sigma 0.5 illumination and the width of the pupil filter equals about half of an aperture diameter of the imaging pupil.

8. The method of claim 4, wherein the pupil filter comprises a plurality of half-tone patterns on a side of the glass that is opposite a side that includes the etched portion, wherein the half-tone patterns are sized and arranged to control the transmission of the output light.

9. A method of inspecting an extreme ultraviolet (EUV) reticle using an optical inspection tool, the method comprising:
   using an inspection tool having a pupil filter positioned at an imaging pupil to obtain a test image or signal from an output beam that is reflected and scattered from a test portion of an EUV test reticle, wherein the pupil filter is configured to provide phase contrast in the output beam;
   obtaining a reference image or signal for a reference reticle portion that is designed to be identical to the test reticle portion;
   comparing the test and reference images or signals and determining whether the test reticle portion has any candidate defects based on such comparison;
   for each of a plurality of test reticle portions of the reticle, repeating the operations for using the inspection tool, obtaining a reference image or signal, comparing, and determining;
   generating a defect report based on any candidate defects that have been determined to be present; and
   designing the pupil filter by simulating defect intensity signals for a plurality of defect types as a function of a phase change angle produced by a plurality of pupil filter configurations.

10. The method of claim 1, wherein the pupil filter is configured to provide phase contrast in the output beam so as to cause a correction in a plurality of intensity tones for a plurality of reticle pattern and defect types.

11. The method of claim 1, wherein the pupil filter is configured to provide phase contrast in the output beam so as to cause a plurality of focus offsets for a plurality of defects types to be substantially equal.

12. The method of claim 1, further comprising selecting the pupil filter from a plurality of pupil filters having different phase contrast effects, wherein such selecting is based on analyzing results from a previously inspected reticle area.

13. An inspection system for inspecting an EUV reticle, comprising:
   a light source for generating an incident beam;
   illumination optics for directing the incident beam onto an EUV reticle;
   collection optics for directing an output beam that is reflected and scattered from the EUV reticle in response to the incident beam, wherein the output beam is directed through a pupil filter towards a sensor;
   the pupil filter positioned in an imaging pupil of the system, wherein the pupil filter is configured to provide phase contrast in the output beam to enhance a signal from any defects as compared to a signal from noise on the reticle, wherein the pupil filter has a design that is based on simulated defect intensity signals for a plurality of defect types as a function of a phase change angle produced by a plurality of pupil filter configurations;
   the sensor for detecting the output beam from the pupil filter and generating an image or signal for such output beam; and
   a controller that is configured to perform the following operations:
      obtaining a reference image or signal for a reference reticle portion that is designed to be identical to the test reticle portion;
      comparing the test and reference images or signals and determining whether the test reticle portion has any candidate defects based on such comparison;
      for each of a plurality of test reticle portions of the reticle, repeating the operations for obtaining a reference image or signal, comparing, and determining; and
      generating a defect report based on any candidate defects that have been determined to be present.

14. The system of claim 13, wherein the pupil filter is configured to provide phase contrast in the output beam so as to enhance a signal strength of a phase object, including a defect, as compared to a non-phase or differently phased object in the test reticle portion.

15. The system of claim 14, wherein the pupil filter is configured to provide phase contrast in the output beam to introduce a phase change so that a phase between light scattered from a phase object more closely matches light reflected from such phase object and such scattered and reflected light can constructively interfere with each other to enhance the phase object's detected image signal.

16. The system of claim 13, wherein the pupil filter is a slab of glass that has an etched portion having a depth corresponding to an amount of phase change that is introduced into a portion of the output beam that is transmitted through the pupil filter.

17. The system of claim 16, wherein the depth is about 85 nm to provide a phase change of 90°.

18. The system of claim 16, wherein the etched portion of the pupil filter has a width that substantially matches an illumination area, which corresponds to a reflected portion of the output light, so as to provide a phase change for such illumination area and not outside such illumination area, which corresponds to a scattered light portion of the output light.

19. The system of claim 18, wherein the illumination area corresponds to a sigma 0.5 illumination and the width of the pupil filter equals about half of an aperture diameter of the imaging pupil.

20. The system of claim 18, wherein the illumination area corresponds to a pupil area that is either smaller or larger than sigma 0.5.

21. The system of claim 16, wherein the pupil filter comprises a plurality of half-tone patterns on a side of the glass that is opposite a side that includes the etched portion, wherein the half-tone patterns are sized and arranged to control the transmission of the output light.

22. The system of claim 13, wherein the pupil filter is configured to provide phase contrast in the output beam so as to cause a correction in a plurality of intensity tones for a plurality of reticle pattern and defect types.

23. The system of claim 13, wherein the pupil filter is configured to provide phase contrast in the output beam so as to cause a plurality of focus offsets for a plurality of defects types to be substantially equal.

24. A method of inspecting an extreme ultraviolet (EUV) reticle using an optical inspection tool, the method comprising:

using an inspection tool to obtain a test image or signal from an output beam that is reflected and scattered from a test portion of an EUV test reticle, wherein the inspection tool is configured to introduce a spherical aberration to provide phase contrast in the output beam so as to enhance a signal strength of a phase object in the form of a defect as compared to a non-phase or differently phased object in the form of noise on the test reticle portion, wherein the inspection tool introduces a spherical aberration from a pupil filter that is designed based on simulated defect intensity signals for a plurality of defect types as a function of a phase change angle produced by a plurality of pupil filter configurations;

obtaining a reference image or signal for a reference reticle portion that is designed to be identical to the test reticle portion;

comparing the test and reference images or signals and determining whether the test reticle portion has any candidate defects based on such comparison;

for each of a plurality of test reticle portions of the reticle, repeating the operations for using the inspection tool, obtaining a reference image or signal, comparing, and determining; and generating a defect report based on any candidate defects that have been determined to be present.

* * * * *